US012680020B2

(12) United States Patent
Feng et al.

(10) Patent No.: US 12,680,020 B2
(45) Date of Patent: Jul. 14, 2026

(54) QUANTUM DOTS MATERIAL SOLUTION, METHOD OF FORMING QUANTUM DOTS LAYER, AND ARRAY SUBSTRATE, DISPLAY PANEL, AND METHOD OF FABRICATING DISPLAY PANEL

(71) Applicants: Beijing BOE Technology Development Co., Ltd., Beijing (CN); BOE Technology Group Co., Ltd., Beijing (CN)

(72) Inventors: Jingwen Feng, Beijing (CN); Wenhai Mei, Beijing (CN); Haowei Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 879 days.

(21) Appl. No.: 17/760,253

(22) PCT Filed: Oct. 28, 2021

(86) PCT No.: PCT/CN2021/127062

§ 371 (c)(1),
(2) Date: Aug. 5, 2022

(87) PCT Pub. No.: WO2023/070444

PCT Pub. Date: May 4, 2023

(65) Prior Publication Data

US 2024/0182783 A1 Jun. 6, 2024

(51) Int. Cl.

| | |
|---|---|
| ***C09K 11/56*** | (2006.01) |
| ***C09K 11/66*** | (2006.01) |
| ***C09K 11/70*** | (2006.01) |
| ***C09K 11/88*** | (2006.01) |
| ***G03F 7/004*** | (2006.01) |

(Continued)

(52) U.S. Cl.

CPC .......... *C09K 11/565* (2013.01); *C09K 11/661* (2013.01); *C09K 11/665* (2013.01);

(Continued)

(58) Field of Classification Search

CPC ... C09K 11/565; C09K 11/661; C09K 11/665; C09K 11/70; C09K 11/883; G03F 7/0045; H10K 59/1201; H10K 71/13; H10K 59/35; H10K 59/38; H10K 71/211; H10K 50/115

See application file for complete search history.

(56) References Cited

U.S. PATENT DOCUMENTS

| | | | | |
|---|---|---|---|---|
| 10,519,366 | B2 | 12/2019 | Qiu et al. | |
| 2003/0066998 | A1 * | 4/2003 | Lee ........................ | B82Y 20/00 257/E29.082 |

(Continued)

FOREIGN PATENT DOCUMENTS

| | | | |
|---|---|---|---|
| CN | 109904335 | A | 6/2019 |
| CN | 110423426 | A | 11/2019 |

(Continued)

OTHER PUBLICATIONS

Klikovits, Nicolas, et al. "Novel photoacid generators for cationic photopolymerization." Polymer Chemistry 8.30 (2017): 4414-4421. (Year: 2017).*

(Continued)

*Primary Examiner* — Norman D Richards
*Assistant Examiner* — Ethan Edward Cutler
(74) *Attorney, Agent, or Firm* — Intellectual Valley Law, P.C.

(57) ABSTRACT

A quantum dots material solution is provided. The quantum dots material solution includes a quantum dots material; a ligand chelated to the quantum dots material; a fast material capable of generating, upon a first irradiation, a quencher (Continued)

quenching the quantum dots material; a second material capable of at least partially converting the quantum dots material in a plurality of block regions from a first form into a second form. The quantum dots material in the second form has a lower solubility in a developing solution than the quantum dots material in the first form.

18 Claims, 15 Drawing Sheets

(51) Int. Cl.
*H10K 59/12* (2023.01)
*H10K 59/35* (2023.01)
*H10K 71/13* (2023.01)

(52) U.S. Cl.
CPC ............ *C09K 11/70* (2013.01); *C09K 11/883* (2013.01); *G03F 7/0045* (2013.01); *H10K 59/1201* (2023.02); *H10K 71/13* (2023.02); *H10K 59/35* (2023.02)

(56) References Cited

U.S. PATENT DOCUMENTS

2017/0256591 A1 9/2017 Li
2020/0127219 A1* 4/2020 Chen ...................... H10K 71/40
2020/0136075 A1* 4/2020 Kanehiro ............. H10K 50/115
2020/0313037 A1* 10/2020 He ....................... C09K 11/883
2021/0095194 A1* 4/2021 Mei ........................ H10K 85/30
2021/0210517 A1* 7/2021 Kawashima ......... G09G 3/3233
2022/0045295 A1 2/2022 Zhang
2022/0127525 A1 4/2022 Wang
2022/0127527 A1 4/2022 Zhang

FOREIGN PATENT DOCUMENTS

CN 111326680 A 6/2020
CN 111900256 A 11/2020
CN 112234149 A 1/2021
CN 112234155 A 1/2021
CN 112259702 A 1/2021
CN 112271269 A 1/2021
CN 112300784 A * 2/2021 ............. C09K 11/02

OTHER PUBLICATIONS

Hezinger, A. F. E., Jörg Teßmar, and Achim Göpferich. "Polymer coating of quantum dots—a powerful tool toward diagnostics and sensorics." European Journal of Pharmaceutics and Biopharmaceutics 68.1 (2008): 138-152. (Year: 2008).*
International Search Report & Written Opinion mailed Jul. 27, 2022, regarding PCT/CN2021/127062.

* cited by examiner

QUANTUM DOTS MATERIAL SOLUTION, METHOD OF FORMING QUANTUM DOTS LAYER, AND ARRAY SUBSTRATE, DISPLAY PANEL, AND METHOD OF FABRICATING DISPLAY PANEL

CROSS-REFERENCE TO RELATED APPLICATION

This application is a national stage application under 35 U.S.C. § 371 of International Application No. PCT/CN2021/127062, filed Oct. 28, 2021, the contents of which are incorporated by reference in the entirety.

TECHNICAL FIELD

The present invention relates to display technology, more particularly, to a quantum dots material solution, a method of forming a quantum dots layer, an array substrate, a display panel, and a method of fabricating a display panel.

BACKGROUND

Quantum dots material las excellent optical and electrical properties, including a marrow emission peak (with a half-peak width of approximately 30 nm), a tunable spectrum (ranging from visible light to infrared light), high photochemical stability, and a low starting voltage. Due to these excellent properties, quantum dots have become a focus of research and development in the fields of display technology.

SUMMARY

In one aspect, the present disclosure provides a quantum dots material solution, comprising a quantum dots material; a ligand chelated to the quantum dots material; a first material capable of generating, upon a first irradiation, a quencher quenching the quantum dots material; and a second material capable of at least partially converting the quantum dots material in a plurality of block regions from a first form into a second form; wherein the quantum dots material in the second form has a lower solubility is a developing solution thaw the quantum dots material in the first form.

Optionally, the first material comprises a photoacid generator, and the quencher comprises a hydrogen ion.

Optionally, the photoacid generator comprises a material selected from a group consisting of a triazine compound, an onium salt compound and a benzenesulfonate compound.

Optionally, the second material is capable of, upon a second irradiation, undergoing a reaction to convert the quantum dots material from the first form into the second forms.

Optionally, upon the second irradiation the second material is capable of reacting with the ligand to form a reacted ligand, which is released from the quantum dots material.

Optionally, the first irradiation requires a light having a first wavelength range; and the second irradiation requires a light having a second wavelength range son-overlapping with the first wavelength range.

Optionally, the ligand comprises a sulfur-containing chelating group, a nitrogen-containing chelating group, an oxygen-containing chelating group, a phosphorus-containing chelating group, or any combination thereof.

Optionally, the ligand is a material selected from a group consisting of an oleic acid, an oleylamine, a trioctylphosphine, a trioctylphosphine oxide, and a dodecanethiol.

Optionally, the second material is an alkene compound or an alkyne compound.

Optionally, the quantum dots material in the second form has a solubility is a developing solution at least 10% lower than a solubility of the quantum dots material in the first form in the developing solution.

Optionally, the quantum dots material comprises a material selected from a group consisting of CdS, CdSe, ZnSe, InP, PbS, CsPbCl3, CsPbBr3, CsPhI3, CdS/ZnS, CdSe/ZnS, ZnSe, InP/ZnS, PbS/ZnS, CsPbCl3/ZnS, CsPbBr3/ZnS, and CsPhI3/ZnS.

In another aspect, the present disclosure provides a method of forming a quantum dots layer, comprising forming a quantum dots material layer comprising a first material; patterning the quantum dots material layer to form a plurality of quantum dots blocks in a plurality of block regions, respectively; converting the first material in an inter-block region into a quencher; and allowing the quencher to quench residual quantum dots material on the inter-block region, thereby forming the quantum dots layer.

Optionally, forming the quantum dots material layer comprises disposing a quantum dots material solution comprising the first material.

Optionally, the first material comprises a photoacid generator, and the quencher comprises a hydrogen ion.

Optionally, converting the first material comprises irradiating the inter-block region.

Optionally, patterning the quantum dots material layer comprises at least partially converting the quantum dots material in the plurality of block regions from a first form into a second form; and developing the quantum dots material layer.

Optionally, developing the quantum dots material layer is performed using a developing solution; wherein the quantum dots material in the second form has a lower solubility in the developing solution than the quantum dots material in the first form.

Optionally, at least partially converting the quantum dots material comprises at least partially removing ligands chelated to the quantum dots material in the plurality of block regions.

Optionally, at least partially converting the quantum dots material comprises irradiating the plurality of block regions; the quantum dots material layer father comprises a second material; and upon irradiating the plurality of block regions, the second material undergoes a reaction to convert the quantum dots material in the plurality of block regions from the first form into the second form.

Optionally, upon irradiating the plurality of block regions, the second material reacts with a ligand of the quantum dots material to form a reacted ligand, the reacted ligand being released how the quantum dots material.

Optionally, the quantum dots material in the second form has a solubility is the developing solution at least 10% lower than a solubility of the quantum dots material in the first form is the developing solution.

In another aspect, the present disclosure provides an array substrate, comprising a quantum dots layer of a first cokes comprising a plurality of first quantum dots blocks is a plurality of first subpixel regions, respectively; a quantum dots layer of a second color comprising a plurality of second quantum dots blocks in a plurality of second subpixel regions, respectively, and a quantum dots layer of a third color, comprising a plurality of third quantum dots blocks is a plurality of third subpixel regions, respectively; wherein the array substrate further comprises quenched quantum dots material of the first color between a respective one of the plurality of second quantum dots blocks and a base substrate, and between a respective one of the plurality of third quantum dots blocks and the base substrate; quantum dots material of the second color on a side of a respective one of the plurality of first quantum dots blocks away from the base substrate, and between the respective one of the plurality of third quantum dots blocks and the base substrate; and quenched quantum dots material of the third color on a side of the respective one of the plurality of first quantum dots blocks away from the base substrate, and on a side of the respective one of the plurality of second quantum dots blocks away from the base substrate.

In another aspect, the present disclosure provides a display panel, comprising the array substrate described herein, wherein the array substrate comprises a plurality of thin film transistors.

Optionally, the quantum dots layer of the first color, the quantum dots layer of the second color, and the quantum dots layer of the third color are a plurality of light emitting layers in the array substrate; wherein the display panel comprises a light emitting element of the first color, a light emitting element of the second color, and a light emitting element of the third color; the light emitting element of the first color comprises a respective first anode, a respective first quantum dots block of the plurality of first quantum dots blocks on the respective first anode, and a cathode on a side of the respective first quantum dots block away from the respective first anode; the light emitting element of the second color comprises a respective second anode, a respective second quantum dots block of the plurality of second quantum dots blocks on the respective second anode, and the cathode on a side of the respective second quantum dots block away from the respective second anode; and the light emitting element of the third color comprises a respective third anode, a respective third quantum dots block of the plurality of thud quantum dots blocks on the respective third anode, and the cathode on a side of the respective third quantum dots block away from the respective third anode.

Optionally, the quantum dots layer of the first color, the quantum dots layer of the second color, and the quantum dots layer of the third color are parts of a color filter layer; the plurality of first quantum dots blocks are a plurality of first color filter blocks; the plurality of second quantum dots blocks are a plurality of second color filter blocks; and the plurality of third quantum dots blocks are a plurality of third color filter blocks.

In another aspect, the present disclosure provides a method of fabricating a display panel, comprising forming the quantum dots layer according to the method described herein; wherein the method of fabricating the display panel comprises forming a first quantum dots material layer comprising a first material on a base substrate; patterning the first quantum dots material layer to form a plurality of first quantum dots blocks in a plurality of first block regions, respectively; converting the first material in a first inter-block region into a quencher; and allowing the quencher to quench first residual quantum dots material in the first aster-block region, thereby forming the first quantum dots layer; subsequent to forming the first quantum dots layer; the method further comprises forming a second quantum dots material layer comprising the first material on the base substrate, patterning the second quantum dots material layer to form a plurality of second quantum dots blocks in a plurality of second block regions, respectively; converting the first material in a second inter-block region into a quencher; and allowing the quencher to quench second residual quantum dots material in the second inter-block region, thereby forming the second quantum dots layer; subsequent to forming she second quantum dots layer, the method further comprises: forming a ford quantum dots material layer comprising the first material on the base substrate; patterning the third quantum dots material layer to forma a plurality of third quantum dots blocks is a plurality of third block regions, respectively, converting the first material in a third inter-block region into a quencher; and allowing the quencher to quench third residual quantum dots material in the third inter-block region, thereby forming the third quantum dots layer.

Optionally, forming the first quantum dots material layer comprises disposing a first quantum dots material solution comprising the first material and a first quantum dots material of a first color; forming the second quantum dots material layer comprises disposing a second quantum dots material solution comprising the first material and a second quantum dots material of a second color; and forming the third quantum dots material layer comprises disposing a third quantum dots material solution comprising the first material and a third quantum dots material of a third color.

Optionally, a concentration of the first material in the first quantum dots material solution is greater than a concentration of the first material in the second quantum dots material solution, which is in fun greater than a concentration of the fast material in the third quantum dots material solution.

Optionally, the first color is a red color, the second color is a green color, and the third color is a blue color.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a quantum dots material solution, a method of forming a quantum dots layer, an array substrate, a display panel, and a method of fabricating a display panel that substantially obviate one or more of the problems due to limitations and disadvantages of the related art. In one aspect, the present disclosure provides a method of forming a quantum dots layer. In some embodiments, the method includes forming a quantum dots material layer comprising a first material; patterning the quantum dots material layer to form a plurality of quantum dots blocks is a plurality of block regions, respectively; converting the first material in an inter-block region into a quencher, and allowing the quencher to quench residual quantum doss material is the inter-block region, thereby forming the quantum dots layer.

Figure 1A:
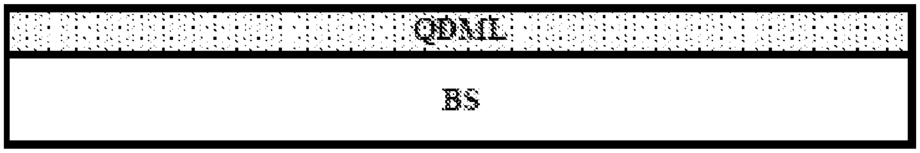
FIG. 1A to FIG. 1E illustrate a process of forming a quantum dots layer is some embodiments according to the present disclosure.

FIG. 1A to FIG. 1E illustrate a process of forming a quantum dots layer in some embodiments according to the present disclosure. Referring to FIG. 1A, the method in some embodiments includes forming a quantum dots material layer QDML comprising a first material, e.g., on a base substrate BS. In some embodiments, forming the quantum dots material layer QDML includes disposing a quantum dots material solution comprising the first material and a quantum dots material, e.g., on the base substrate BS. The quantum dots material solution may be printed or coated onto the base substrate BS.

Figure 1B:
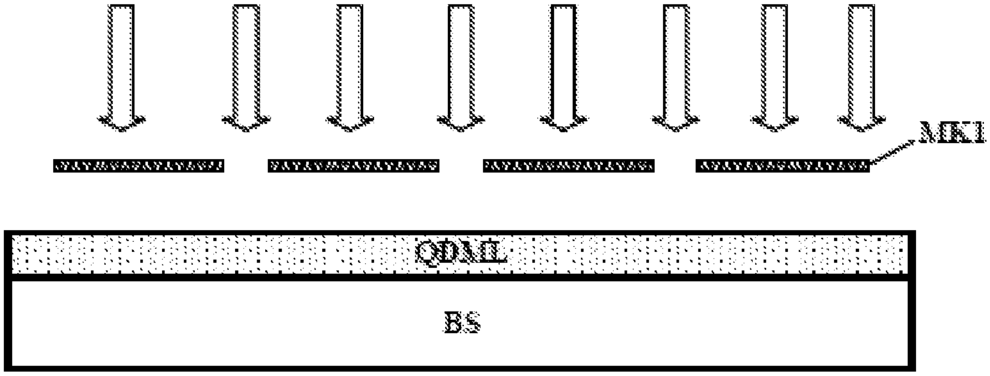
Figure 1C:
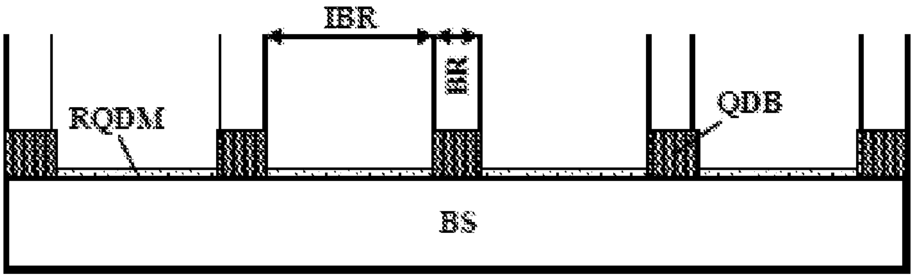

Referring to FIG. 1B and FIG. 1C, the method is some embodiments further includes patterning the quantum dots material layer QDML to form a plurality of quantum dots blocks QDB in a plurality of block regions BR, respectively. Specifically, the step of patterning in some embodiments includes exposing the quantum dots material layer QDML with a first irradiation (FIG. 1B), wing a first mask plate MK1. The first mask plate MK1 has a plurality of light transmissive regions corresponding to a plurality of block regions in which a plurality of quantum dots blocks are to be formed, and a light blocking region corresponding to an inter-block region.

The step of patterning is some embodiments father includes developing the exposed quantum dots material layer with a developing solution (FIG. 1C). The developing solution selectively removes the quantum dots material in the inter-block region IBR over the quantum dots material in the plurality of block regions BR. In one example, the quantum dots material in the inter-block region IBR (unexposed) has a higher solubility in the developing solution than the quantum dots material is the plurality of block regions BR (exposed). Subsequent to the developing step, residual quantum dots material RQDM remains in the inter-block region IBR. If untreated or unremoved, the residual quantum dots material RQDM is capable of emitting light, resulting in color cross-talk or color mixing in a display panel having a quantum dots layer.

Figure 1D:
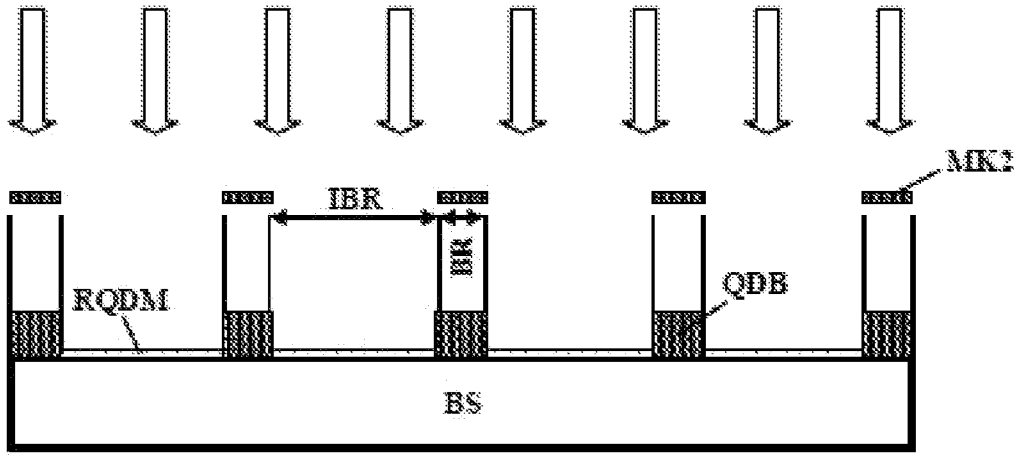

In some embodiments, the method further includes converting the first material in an inter-block region IBR into a quencher, and allowing the quencher to quench residual quantum dots material in the inter-block region BR, thereby forming the quantum dots layer QDL. Referring to FIG. 1D, the step of converting the first material includes, subsequent to the developing step, exposing the quantum dots material layer with a second irradiation. Specifically, the converting step includes irradiating the inter-block region IBR using a second mask plate MK2. The second mask plate MK2 has a plurality of light blocking regions corresponding to the plurality of block regions BR having plurality of quantum dots blocks QDB, and a light transmissive region corresponding to the inter-block region IR having the residual quantum dots material RQDM.

In some embodiments, the first material is a material capable of generating, upon a first irradiation, a quencher quenching the quantum dots material. Various appropriate first materials may be used in the present disclosure. In some embodiments, the first material includes a photoacid generator; and the quencher includes a hydrogen ion. Examples of photoacid generators include a triazine compound an onium salt compound, and a benzenesulfonate compound. Specific examples of photoacid generators include sulfonium salts (e.g., triphenyl sulfonium hexafluoroantimonate), triazines (e.g., (4,6)-bis(trichloromethyl)-1,3,5 triazine derivatives), sulfonate esters (e.g., N-tosyl oxyphthalimide), diazo salts (e.g., diazo fluoroborate). Various appropriate quencher may be used in the present disclosure. Examples of quenchers for quenching the quantum dots material include hydrogen ion.

In one example, the photoacid generator includes $Ph_3ICF_3SO_3$. An exemplary process of generating, upon the first irradiation, a quencher ($H^+$ ion) is illustrated below:

$$Ph_3ICF_3SO_3 \xrightarrow{254\text{ nm}} Ph^- + \xrightarrow{H2O} PhOh + H^+$$

The hydrogen ion is capable of quenching the quantum dots material by reacting with the quantum dots material. In one example, the quantum dots material has a core-shell structure. In another example, the core portion of the quantum dots material includes CdSe, and the shell portion of the quantum dots material includes ZnS. The hydrogen ion first reacts with the shell portion to dissolve the zinc sulfide, then further corrodes the core portion, causing the quantum dots to dissolve. The quenching results in a decrease or complete elimination of quantum dots fluorescence intensity.

Figure 1E:
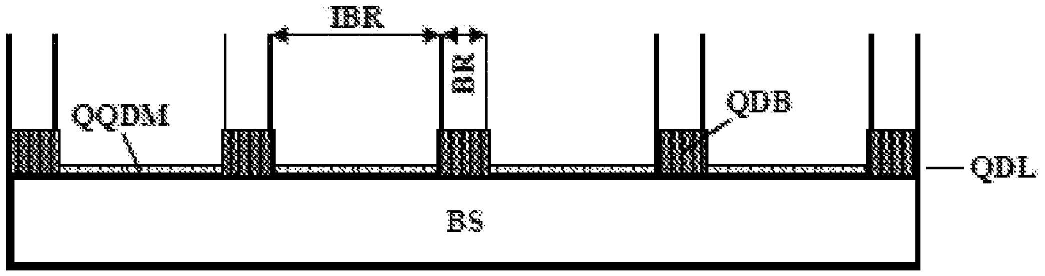

Referring to FIG. 1E, subsequent to quenching the residual quantum dots material in the inter-block region IBR, she residual quantum dots material in the inter-block region IBR is at least partially converted into a quenched quantum dots material QQDM. A quantum dots layer QDL is formed, the quantum dots layer QDL includes a plurality of quantum dots blocks QDB in the plurality of block regions BR, respectively, and the quenched quantum dots material QQDM in the inter block region IBR. The quenched quantum dots material QQDM is no longer capable of emitting light, thereby reducing or eliminating color cross-talk or color mixing in a display panel having the quantum dots layer QDL. Display quality can be significantly improved in a display panel having a quantum dots layer fabricated according to the present method.

As discussed above, the developing solution in the step of patterning in some embodiments is capable of selectively removing the quantum dots material in the inter-block region IBR over the quantum dots material is the plurality of block regions BR (FIG. 1C). In order to achieve the selectivity, the method in some embodiments further includes at least partially converting she quantum dots material as the plurality of block regions from a first forma into a second form; and developing the quantum dots material layer. Optionally, the quantum dots material in the second form has a lower solubility in the developing solution than the quantum dots material in the first form. Because the quantum dots material in the second form has a lower solubility in the developing solution than the quantum dots material in the fast form, a majority of quantum dots material in the plurality of block regions (second form) remains subsequent to the developing step, whereas a majority of quantum dots material in the inter-block region (first form) are removed. As used herein, the term "lower solubility" refers to that the quantum dots material in the second form has a solubility is the developing solution at least 10% (e.g., at least 15%, at least 20%, at least 25%, at least 30%, at least 35%, at least 40%, at least 45%, at least 50%, at least 55%, at least 60%, at least 65%, at least 70%, at least 75%, at least 80%, at least 85%, at least 901%, at least 95%, or at least 99%) lower than a solubility of the quantum dots material in the first form in the developing solution, In some embodiments, at least partially converting the quantum dots material includes at least partially removing ligands chelated to the quantum dots material in the plurality of block regions. The quantum dots material in the first form has more ligand chelated than the quantum dots material in the second form. In one example, the developing solution includes a non-polar solvent, the ligand is a molecule having a non-polar group, thus removing ligands from the quantum dots material rendering the quantum dots material more polar. Subsequent to removing ligands chelated to the quantum dots material in the plurality of block regions, the solubility of the quantum dots material in the plurality of block regions (second form) decreases, thereby remaining in the plurality of block regions during the developing step.

Various appropriate methods may be wed for removing the ligands from the quantum dots material in the plurality of block regions. In some embodiments, the quantum dots material layer farther comprises a second material. Referring to FIG. 1B, upon irradiating the plurality of block regions BR with the first irradiation, the second material undergoes a reaction to convert the quantum dots material in the plurality of block regions BR from the first form into the second form. In some embodiments, upon irradiating the plurality of block regions BR, the second material reacts with a ligand of the quantum dots material to form a reacted ligand, the reacted ligand being released from the quantum dots material.

Figure 2:
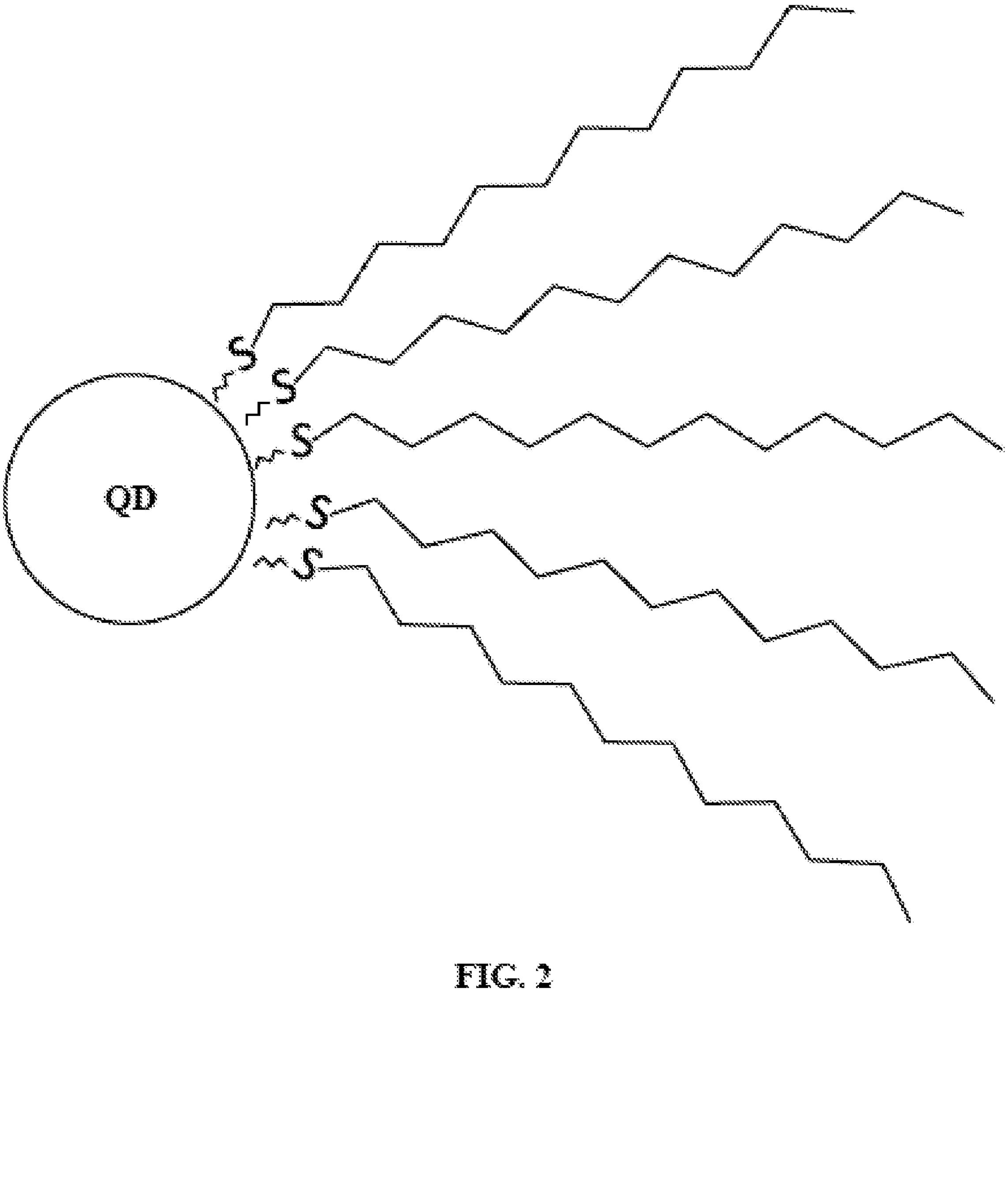
FIG. 2 is a schematic diagrams illustrating the structure of a quantum dot having dodecanethiol chelated to a surface of the quantum dot.

In one example, the ligand chelated to the quantum dots material is a ligand having a thiol group, which is the group that is chelated to, for example, a shell portion of the quantum dots material. In another example, the second material is an alkene compound or an alkyne compound. Is another example, the ligand and the second material undergo a click reaction to form a reacted ligand, which is no longer capable of chelating to the quantum dots material. FIG. 2 is a schematic diagram illustrating the structure of a quantum dot having dodecanethiol chelated to a surface of the quantum dot. As shown in FIG. 2, the dodecanethiol ligand has a highly non-polar group ($-C_{12}H_{26}$), rendering the quantum dot soluble in a son-polar solvent such as toluene. The dodecanethiol ligand and an alkene compound or an alkyne compound can undergo a click reaction.

Figure 3:
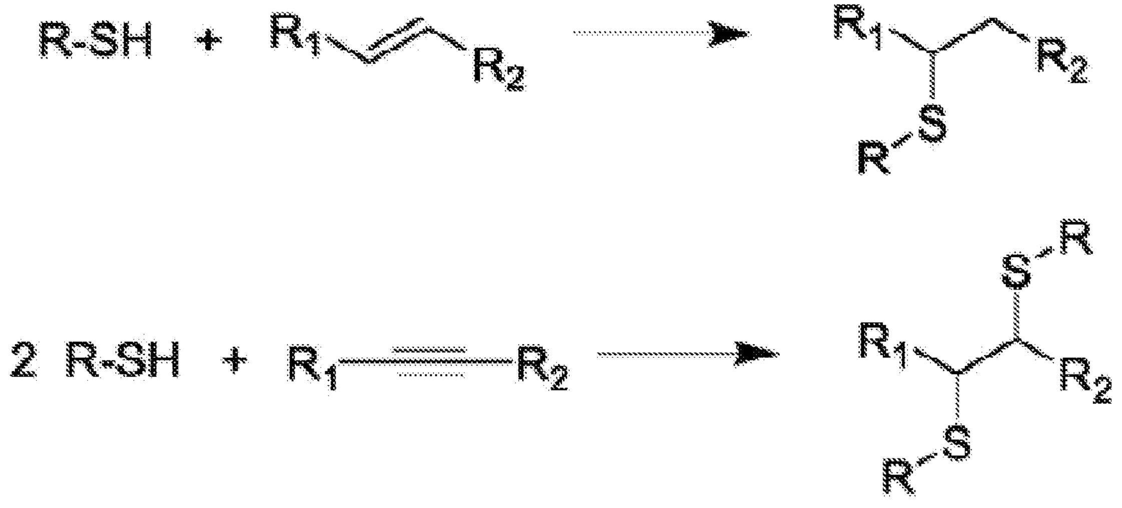
FIG. 3 illustrates reactions between a thiol-containing ligand and an alkene compound or an alkyne compound.
Figure 4:
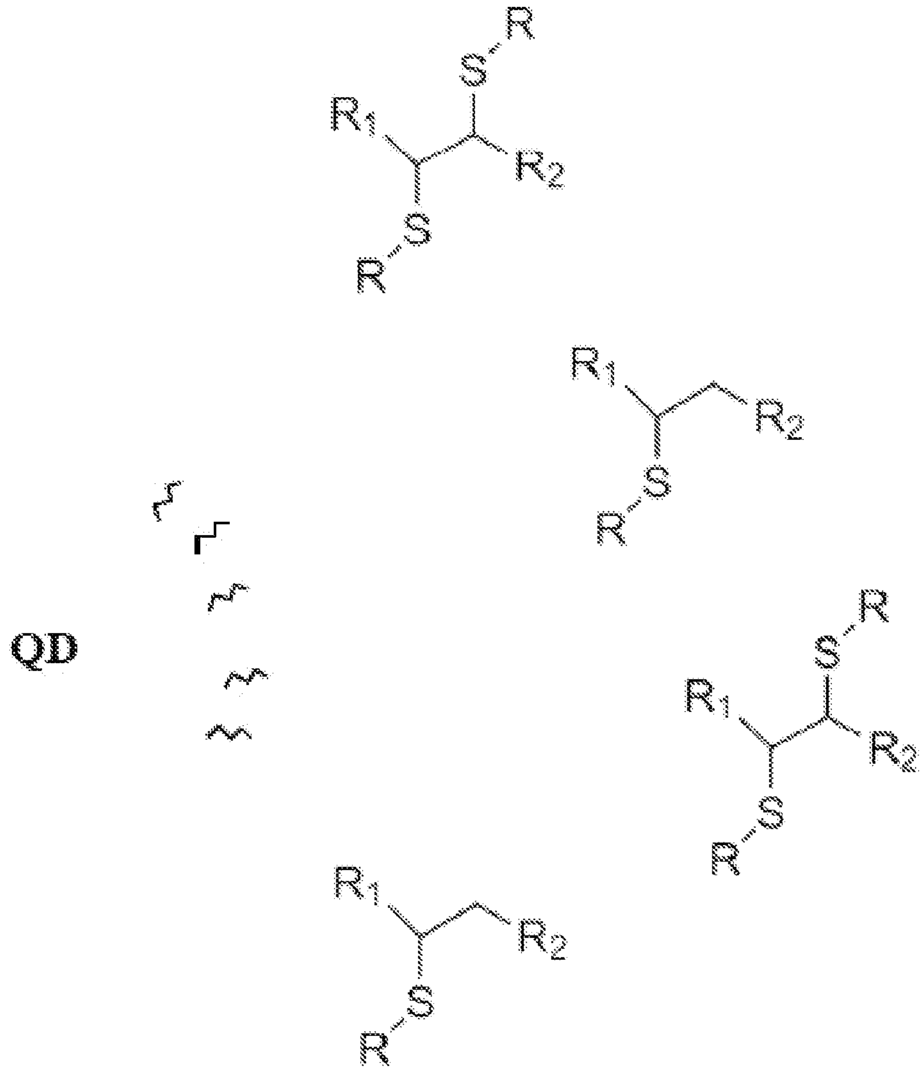
FIG. 4 is a schematic diagram illustrating the structure of a quantum dot with ligands removed by a second material.

FIG. 3 illustrates reactions between a thiol-containing ligand and an alkene compound or as alkyne compound. Referring to FIG. 3, upon reacting with the alkene compound or the alkyne compound, the thiol group is modified by a bulky organic group. Due to the spatial resistance effect introduced by the bulky organic group, the reacted ligand can no longer be chelated to the surface of the quantum dot. FIG. 4 is a schematic diagram illustrating the structure of a quantum dot with ligands removed by a second material. Referring to FIG. 4, the quantum dot is shipped off the ligands. Comparing the quantum dot in FIG. 2 and FIG. 4, the quantum dot in FIG. 2 has the ligand with a non-polar group in a chelated form, whereas the quantum dot in FIG. 4 has the ligand removed. The quantum dot in FIG. 4 is not soluble or has a small solubility in a non-polar solvent such as toluene. Referring to FIG. 1B and FIG. 1C, a majority of the quantum dots material in the plurality of block regions BR remains subsequent to the developing step, and a majority of the quantum dots material in the inter-block region IBR is washed off by the developing solution.

The thiol-ene (thiol-alkene) reaction or thiol-yne (thiol-alkyne) reaction may be initiated by various appropriate mechanisms, for example, by a radical initiator or by a catalyst. When the reactions are catalyzed by a catalyst, light is not required. When the reactions are initiated by a radical initiator, the reaction may be initiated by, e.g., a photoinitiator to generate a radical. FIG. 1B illustrates a click reaction initiated by light.

Referring to FIG. 1B and FIG. 1D, in some embodiments, the first irradiation requires a light having a first wavelength range (FIG. 1B); and the second irradiation requires a light having a second wavelength range (FIG. 1D). The first wavelength range and the second wavelength range may be non-overlapping, partially overlapping, or overlapping. Optionally, the first wavelength range is non-overlapping with the second wavelength range.

Various appropriate ligands may be used in the present method. Examples of ligands include a sulfur-containing chelating group, a nitrogen-containing chelating group, an oxygen-containing chelating group, a phosphorus-containing chelating group, or any combination thereof. Optionally, the ligand is a material selected from a group consisting of an oleic acid, an oleylamine, a trioctylphosphine, a trioctylphosphine oxide, and a dodecanethiol.

Various appropriate second materials ay be used in the present method. Examples of second materials include an alkene compound or an alkyne compound.

Various appropriate quantum dots materials may be used in the present method. Examples of quantum dots materials include CdS, CdSe, ZnSe, InP, PbS, CsPbCl3, CsPbBr3, CsPhI3, CdS/ZnS, CdSe/ZnS, ZnSe, InP/ZnS, PbS/ZnS, CsPbCl3/ZnS, CsPbBr3/ZnS, and CsPhI3/ZnS.

Figure 5:
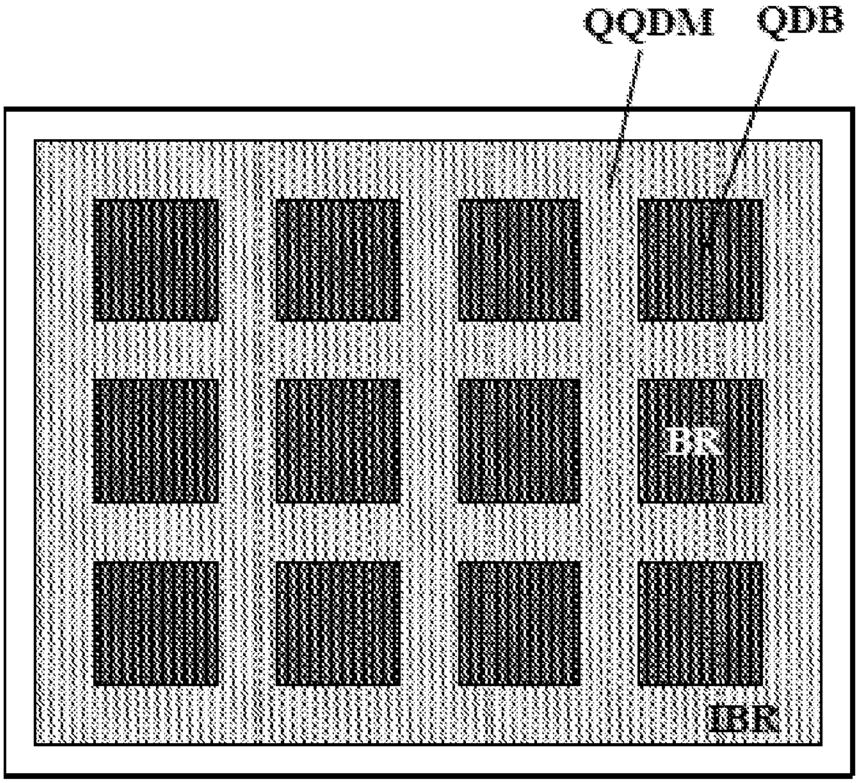
FIG. 5 is a plan view of a quantum dots layer fabricated according to a method in some embodiments according to the present disclosure.

FIG. 5 is a plan view of a quantum dots layer fabricated according to a method is some embodiments according to the present disclosure. As shown in FIG. 5, the plurality of quantum dots blocks QDB are formed in the plurality of block regions BR, and the quenched quantum dots material QQDM is at least partially remaining in the inter-block region IBR A respective quantum dots block is surrounding by the inter-block region IBR. Optionally, the plurality of quantum dots blocks QDB are arranged in an array. The inventors of the present disclosure discover that, surprisingly and unexpectedly, by using the quantum dots material solution having the first material and the second material, a synergistic effect can be achieved for optimal patterning. For example, the plurality of quantum dots blocks QDB are configured to emit light whereas the quenched quantum dots material QQDM is not. Optionally, in a display panel having the quantum dot layer fabricated according to the present method, a ratio of light emission intensity per unit area of the plurality of quantum dots blocks QDB to light emission intensity per unit area of the quenched quantum dots material QQDM is greater than 95:1, e.g., greater than 100:1, greater than 100:1, greater than 500:1, greater than 1000:1, greater than 10000:1, greater than 100000:1, greater than 1000000:1, or greater thaw 10000000:1.

Optionally, in the quantum dots material solution, a concentration of the first material is in a range of 1% w/w to 50% w/w, e.g., 1% w/w to 2% w/w, 2% w/w to 5% w/w, 5% w/w to 10% w/w, 10% w/w to 15% w/w, 15% w/w to 20% w/w, 20% w/w, 25% w/w to 30% w/w, 30% w/w to 35% w/w, 35% w/w to 40% w/w, 40% w/w to 45 w/w to 50% w/w.

Optionally, in the quantum dots material solution, a concentration of the second material is in a range of 1% w/w to 50% w/w, e.g., 1% w/w to 2% w/w, 2% w/w to 5% w/w, 5% w/w to 10% w/w, 10% w/w to 15% w/w, 15% w/w to 20% w/w, 20% w/w to 25% w/w, 25% w/w to 30% w/w, 30% w/w to 35% w/w, 35% w/w to 40% w/w, or 45% w/w to 50% w/w.

Optionally, a ratio of the concentration of the first material to the concentration of the second material is between 10:1 to 1:10, e.g., 10:1 to 8:1, 8:1 to 6:1, 6:1 to 4:1, 4:1 to 2:1, 2:1 to 1:2, 1:2 to 1:4, 1:4 to 1:6, 1:6 to 1:8, or 1:8 to 1:10.

In some embodiments, the developing solution selectively removes the quantum dots material in the inter-block region IR over the quantum dots material is the plurality of block regions BR; and selectively removes the quantum dots material in the inter-block region IBR over the first material. In one example, a majority of the quantum dots material is the inter-block region IBR is dissolved by the developing solution; however, at least a portion of the fest material remain undissolved in the inter-block region IBR. The first material remain in the inter-block region IBR may be used, upon the second irradiation, to quench the residual quantum dots material in the inter-block region IBR.

In some embodiments, the selectivity may be achieved by using a developing solution having at least one non-polar solvent (e.g., toluene), a quantum dots material having a ligand which includes a non-polar group (at least a portion, e.g., a portion exposed to the environment or unbound to the quantum dots), and a first material that is a polar or ionic. As used herein, the term "non-polar" means that characteristic of a molecule or compound that creates an equal charge, partial charge or spontaneous charge distribution at one point of or along the molecule or compound. Optionally, a non-polar solvent refers to a compound which is immiscible with an ionic liquid. In one example, the non-polar solvent refers to a solvent which has a dielectric constant of no more than 7.0 (e.g., no more than 6.0, no more than 5.5, no more than 5.0, no more than 4.5, no more than 4.0, no more than 3.5, no more than 3.0, no more than 2.5, or no more than 2.0), measured at 20 degrees and atmospheric pressure according to ASTM D924-92. As used herein the term "polar" means that characteristic of a molecule or compound that creates an unequal charge, partial charge or spontaneous charge distribution at one point of or along the molecule or compound. Optionally, a polar material refers to a material which has a dielectric constant of greater than 7.0 (e.g., greater than 7.5, greater than 8.0, greater than 8.3, greater than 9.0, greater than 9.5, greater than 10.0, greater than 10.5, greater than 11.0, greater than 11.5, greater than 12.0, greater than 12.5, greater than 13.0, greater than 13.5, greater than 14.0, greater than 14.5, or greater than 15.0).

It is highly desirable to remove the second material from the inter-block region IBR, along with the majority of the quantum dots material therein, so as to maintain the quantum dots material in the first form prior to quenching. This is particularly critical when the first wavelength range (corresponding to light in the first irradiation) and the second wavelength range (corresponding to light in the second irradiation) partially overlap or are the same. In some embodiments, the developing solution selectively removes the second material and the quantum dots material is the inter-block region IBR over the quantum dots material in the plurality of block regions BR; and selectively removes the second material and the quantum dots material in the inter-block region IBR over the first material. In one example, a majority of the quantum dots material in the inter-block region IBR and a majority (e.g., all) of the second material are dissolved by the developing solution; however, at least a portion of the first material remain undissolved in the inter-block region IBR. The first material remain in the inter-block region IBR may be used, upon the second irradiation, so quench the residual quantum dots material in the inter-block region DR.

In some embodiments, the selectivity may be achieved by using a developing solution having at least one non-polar solvent (e.g., toluene), a second material that is son-polar, a quantum dots material having a ligand which includes a non-polar group (at least a portion, e.g., a portion exposed to the environment or unbound to the quantum dots), and a first material that is a polar or ionic. In the example, the won-polar solvent refers to a solvent which has a dielectric constant of no more than 7.0 (e.g., no more than 6.0, no more than 5.5, no more than 5.0, no more than 4.5, no more than 4.0, no more than 3.5, no more than 3.0, no more than 2.5, or no more than 3.0), measured at 30 degrees and atmospheric pressure according to ASTM D924-92. Optionally, a non-polar second material refers to a compound which is immiscible with an ionic liquid. In the example, the non-polar second material refers to a second material which has a dielectric constant of no more than 7.0 (e.g., no more than 6.0, no more than 5.5, no more than 5.0, no more than 4.5, no more than 4.0, no more than 3.5, no more than 3.0, no more than 2.5), measured at 10 degrees and atmospheric pressure according to ASTM D924-92. Optionally, a polar material refers to a material which has a dielectric constant of greater than 7.0 (e.g., greater than 7.5, greater than 8.0, greater than 8.5, greater than 9.0, greater than 9.5, greater than 10.0, greater than 10.5, greater than 11.0, greater than 11.5, greater than 12.0, greater than 12.5, greater than 13.0, greater than 13.5, greater than 14.0, greater than 14.5, or greater than 15.0).

Figure 6A:
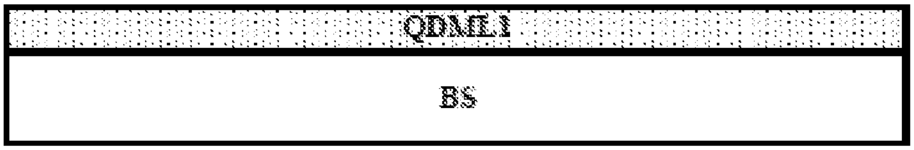
FIG. 6A to FIG. 6E illustrate a process of forming a quantum dots layer of a first color in some embodiments according to the present disclosure.

The present method may be used for fabricating a plurality of quantum dots layer of different colors. FIG. 6A to FIG. 6E illustrate a process of forming a quantum dots layer of a first color in some embodiments according to the present disclosure. Referring to FIG. 6A, the method in some embodiments includes forming a first quantum dots material layer QDML1 comprising a first material on a base substrate BS. In some embodiments, forming the first quantum dots material layer QDML1 includes disposing a first quantum dots material solution comprising the first material and a quantum dots material of a first color ow the base substrate BS.

Figure 6B:
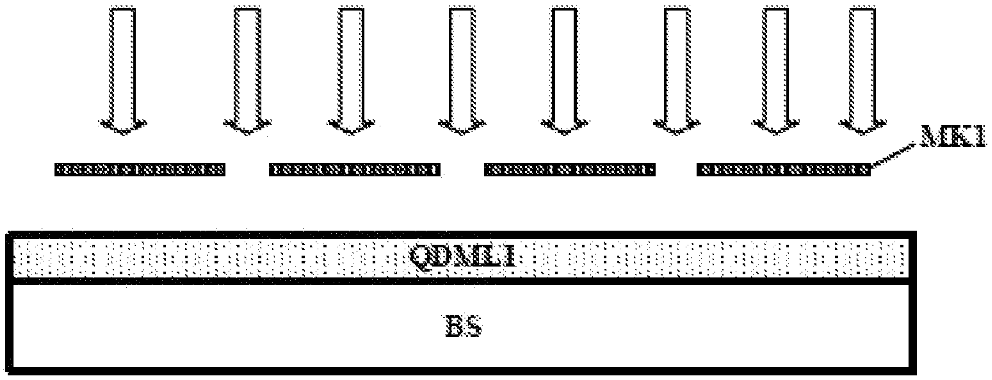
Figure 6C:
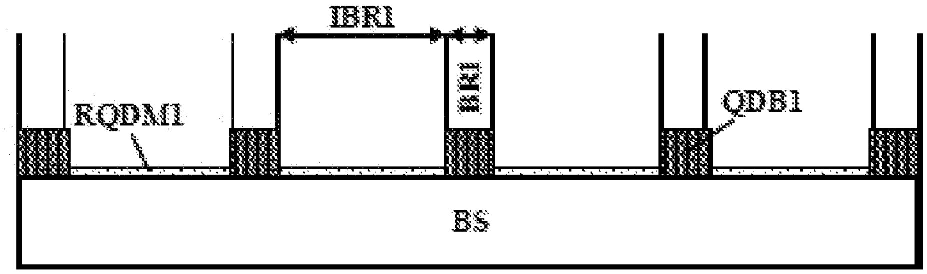

Referring to FIG. 6B and FIG. 6C, the method is some embodiments father includes patterning the first quantum dots material layer QDML1 to form a plurality of first quantum dots blocks QDB1 as a plurality of first block regions BR1, respectively. Specifically, the step of patterning is some embodiments includes exposing the first quantum dots material layer QDML1 with a first irradiation (FIG. 6B), using a first mask plate MK1.

The step of patterning is some embodiments further includes developing the exposed first quantum dots material layer with a developing solution (FIG. 6C). The developing solution selectively removes the quantum dots material is the first inter-block region BR1 over the quantum dots material of the first color is the plurality of first block regions BR1. In one example, the quantum dots material of the first color in the first inter-block region BR1 (unexposed) has a higher solubility in the developing solution than the quantum dots material of the first color in the plurality of first block regions BR1 (exposed). Subsequent to the developing step, first residual quantum dots material RQDM1 remains is the first inter-block region IBR1.

Figure 6D:
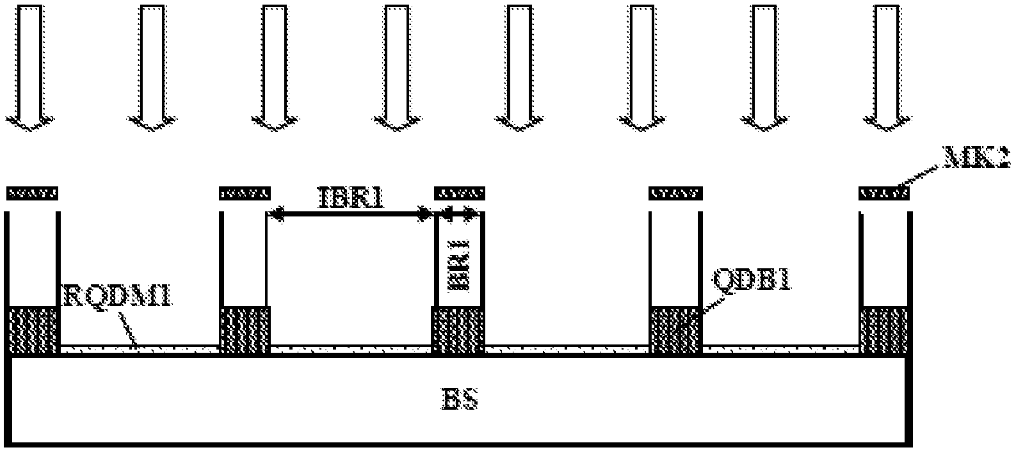

In some embodiment, the method further includes converting the first material in the first inter-block region IBR1 into a quencher; and allowing the quencher to quench first residual quantum dots material in the first inter-block region IBR1, thereby forming the first quantum dots layer QDL1. Referring to FIG. 6D, the step of converting the first material includes, subsequent to the developing step, exposing the first quantum dots material layer QDML1 with a second irradiation. Specifically, the converting step includes irradiating the first inter-block region IBR1 using a second mask plate MK2. In some embodiments, the first material is a material capable of generating, upon a first irradiation, a quencher quenching the quantum dots material.

Figure 6E:
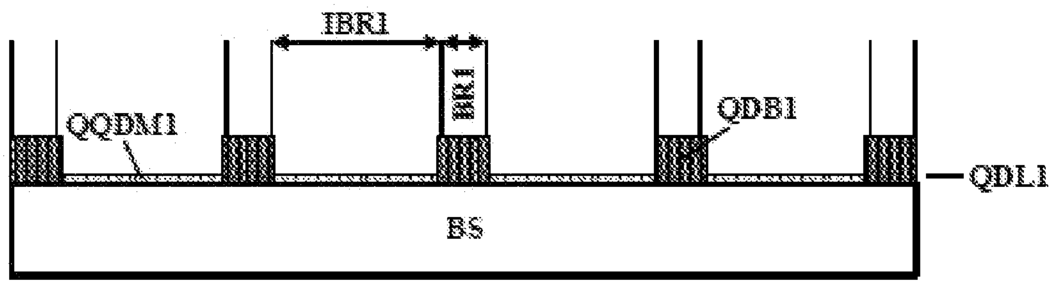

Referring to FIG. 6E, subsequent to quenching the first residual quantum dots material in the first inter-block region IBR1, the first residual quantum dots material in the first inter-block region IBR1 is at least partially converted into a first quenched quantum dots material QQDM1. A quantum dots layer of a first color QDL1 is formed, the quantum dots layer of the first color QDL1 includes a plurality of first quantum dots blocks QDB1 in the plurality of first block regions BR1, respectively, and the fast quenched quantum dots material QQDM1 in the first inter-block region IBR1. The first quenched quantum dots material QQDM1 is no longer capable of emitting light.

In some embodiment, the method father includes at least partially converting the quantum dots material of the first color in the plurality of first block regions BR1 from a first form into a second form; and developing the first quantum dots material layer QQDM1.

Optionally, the quantum dots material of the first color in the second form has a lower solubility is the developing solution than the quantum dots material of the first color in the first form. Because the quantum dots material of the first color in the second form has a lower solubility in the developing solution than the quantum dots material of the first color in the first form, a majority of quantum dots material of the first color in the plurality of first block regions (second form) remains subsequent to the developing step, whereas a majority of quantum dots material of the first color in the first inter-block region (first form) are removed.

In some embodiments, at least partially converting the quantum dots material of the first color includes at least partially removing ligands chelated to the quantum dots material of the first color in the plurality of first block regions. The quantum dots material of the first color is the first form has more ligand chelated than the quantum dots material of the first color in the second form. In one example, the developing solution includes a non-polar solvent, the ligand is a molecule having a non-polar group, thus removing ligands from the quantum dots material of the first color rendering the quantum dots material of the first color more polar. Subsequent to removing ligands chelated to the quantum dots material of the first color in the plurality of first block regions, the solubility of the quantum dots material of the first color is the plurality of first block regions (second form) decreases, thereby remaining in the plurality of first block regions during the developing step.

In some embodiments, the first quantum dots material layer further includes a second material. Referring to FIG. 6B, upon irradiating the plurality of first block regions BR1 with the first irradiation, the second material undergoes a reaction to convert the quantum dots material of the first color in the plurality of first block regions BR1 from the first form into the second form. In some embodiments, upon irradiating the plurality of first block regions BR1, the second material reacts with a ligand of the quantum dots material of the first color to form a reacted ligand, the reacted ligand being released from the quantum dots material of the first color.

Figure 7A:
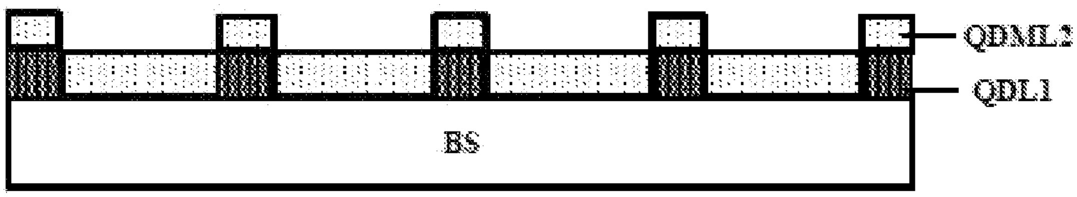
FIG. 7A to FIG. 7E illustrate a process of forming a quantum dots layer of a second color in some embodiments according to the present disclosure.

FIG. 7A to FIG. 7E illustrate a process of forming a quantum dots layer of a second color in some embodiments according to the present disclosure. Referring to FIG. 7A, the method in some embodiments includes forming a second quantum dots material layer QDML2 comprising a first material on a base substrate BS. In some embodiments, forming the second quantum dots material layer QDML2 includes disposing a second quantum dots material solution comprising the first material and a quantum dots material of a second color on the base substrate BS. The second quantum dots material layer QDML2 is formed on a side of the quantum dots layer of the first color QDL1 away from the base substrate BS. At least a portion of the second quantum dots material layer QDML2 is formed on top of the plurality of first quantum dots blocks.

Figure 7B:
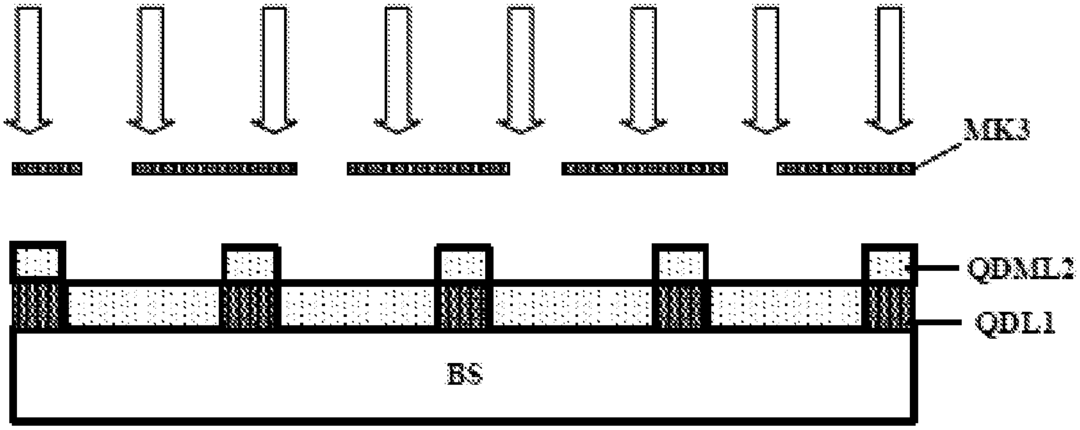
Figure 7C:
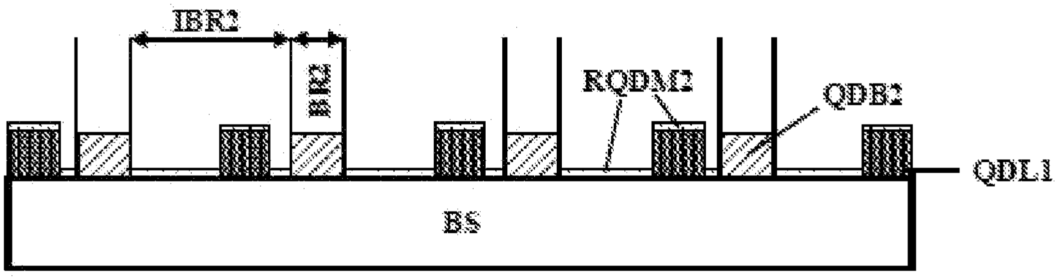

Referring to FIG. 7B and FIG. 7C, the method in some embodiments further includes patterning the second quantum dots material layer QDML2 to form a plurality of second quantum dots blocks QDB2 in a plurality of second block regions BR2, respectively. Specifically, the step of patterning is some embodiments includes exposing the second quantum dots material layer QDML2 with the first irradiation (FIG. 7B), using a third mask plate MK3. The plurality of second quantum dots blocks QDB2 is outside the second inter-block region IBR2; however, the plurality of first quantum dots blocks is inside the second inter-block region IBR2.

The step of patterning is some embodiments further includes developing the exposed second quantum dots material layer with a developing solution (FIG. 7C). The developing solution selectively removes the quantum dots material in the second inter-block region IBR2 over the quantum dots material of the second color in the plurality of second block regions BR2. In one example, the quantum dots material of the second color is the second inter-block region IBR2 (unexposed) has a higher solubility in the developing solution than the quantum dots material of the second color in the plurality of second block regions BR2 (exposed). Subsequent to the developing step, second residual quantum dots material RQDM2 remains in the second inter-block region IBR2. At least a portion of the second residual quantum dots material RQDM2 is on top of the plurality of first quantum dots blocks.

Figure 7D:
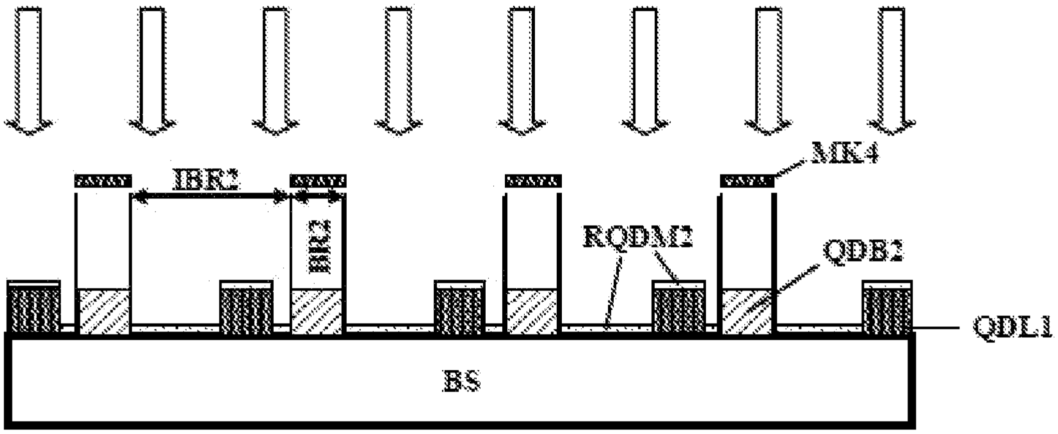

In some embodiments, the method further includes converting the first material in the second inter-block region IBR2 into a quencher; and allowing the quencher to quench second residual quantum dots material in the second inter-block region IBR2, thereby forming the second quantum dots layer QDL2. Referring to FIG. 7D, the step of converting the first material includes, subsequent to the developing step, exposing the second quantum dots material layer QDML2 with a second irradiation. Specifically, the converting step inches irradiating the second inter-block region IBR2 using a fourth mask plate MK4. In some embodiments, the first material is a material capable of generating, upon a first irradiation, a quencher quenching the quantum dots material. As discussed above, at least a portion of the second residual quantum dots material RQDM2 is on top of the plurality of first quantum dots blocks. If untreated or unremoved, the second residual quantum dots material RQDM2 on top of the plurality of first quantum dots blocks would cause color cross-talk or color mixing, adversely affecting display quality. The present method obviates this issue by quenching.

Figure 7E:
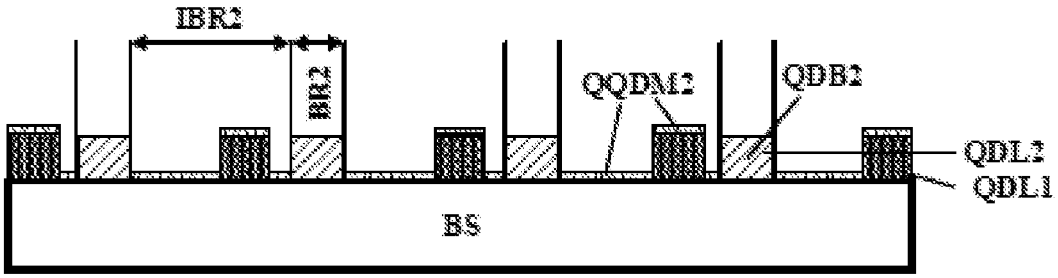

Referring to FIG. 7E, subsequent to quenching the second residual quantum dots material in the second inter-block region IBR2, the second residual quantum dots material in the second inter-block region IBR2 is at least partially converted into a second quenched quantum dots material QQDM2. A quantum dots layer of a second color QDL2 is formed, the quantum dots layer of the second color QDL2 includes a plurality of second quantum dots blocks QDB2 in the plurality of second block regions BR2, respectively, and the second quenched quantum dots material QQDM2 in the second inter-block region IBR2. The second quenched quantum dots material QQDM2 is no longer capable of emitting light.

In some embodiments, the method father includes at least partially converting the quantum dots material of the second color in the plurality of second block regions BR1 from a first form into a second form; and developing the second quantum dots material layer QQDM2. Optionally, the quantum dots material of the second color in the second forma has a lower solubility as the developing solution than the quantum dots material of the second color in the fast form. Because the quantum dots material of the second color in the second form has a lower solubility in the developing solution than the quantum dots material of the second color in the first form, a majority of quantum dots material of the second color in the plurality of second block regions (second form) remains subsequent to the developing step, whereas a majority of quantum dots material of the second color in the second inter-block region (first form) are removed.

In some embodiments, at least partially converting the quantum dots material of the second color includes at least partially removing ligands chelated to the quantum dots material of the second color in the plurality of second block regions. The quantum dots material of the second color in the first form has more ligand chelated then the quantum dots material of the second color in the second form. In one example, the developing solution includes a non-polar solvent, the ligand is a molecule having a non-polar group, thus removing ligands from the quantum dots material of the second color rendering the quantum dots material of the second color more polar. Subsequent to removing ligands chelated to the quantum dots material of the second color in the plurality of second block regions, the solubility of the quantum dots material of the second color in the plurality of second block regions (second form) decreases, thereby remaining in the plurality of second block regions during the developing step.

In some embodiments, the second quantum dots material layer further includes a second material. Referring to FIG. 7B, upon irradiating the plurality of second block regions BR2 with the first irradiation, the second material undergoes a reaction to convert the quantum dots material of the second color in the plurality of second block regions BR2 from the first form into the second form. In some embodiments, upon irradiating the plurality of second block regions BR2, the second material reacts with a ligand of the quantum dots material of the second color to form a reacted ligand, the reacted ligand being released how the quantum dots material of the second color.

Figure 8A:
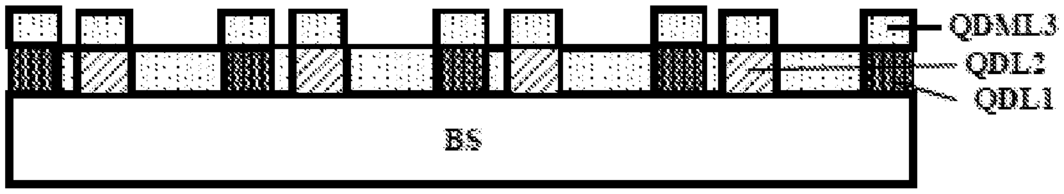
FIG. 8A to FIG. 8E illustrate a process of forming a quantum dots layer of a third color in some embodiments according to the present disclosure.

FIG. 8A to FIG. 8E illustrate a process of forming a quantum dots layer of a third color in some embodiments according to the present disclosure. Referring to FIG. 8A, the method in some embodiments includes forming a third quantum dots material layer QDML3 comprising a first material on a base substrate BS. In some embodiments, forming the ford quantum dots material layer QDML3 includes disposing a third quantum dots material solution comprising the first material and a quantum dots material of a third color on the base substrate BS. The third quantum dots material layer QDML3 is formed on a side of the quantum dots layer of the first color QDL1 and the quantum dots layer of the second color QDL2 away from the base substrate BS. At least a portion of the third quantum dots material layer QDML3 is formed on top of the plurality of first quantum dots blocks and the plurality of second quantum dots blocks.

Figure 8B:
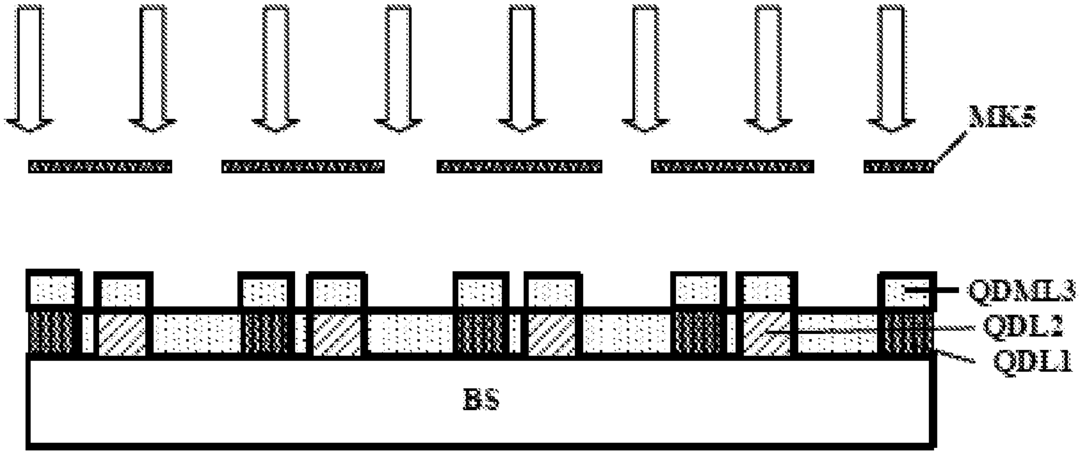
Figure 8C:
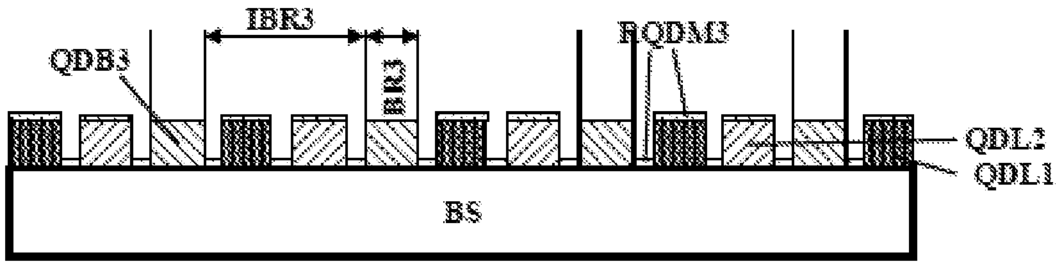

Referring to FIG. 8B and FIG. 8C, the method is some embodiments further includes patterning the third quantum dots material layer QDML3 to form a plurality of third quantum dots blocks QDB3 is a plurality of third block regions BR3, respectively. Specifically, the step of patterning in some embodiments includes exposing the third quantum dots material layer QDML3 with the first irradiation (FIG. 8B), using a fifth mask plate MK5. The plurality of third quantum dots blocks QDB3 is outside the third inter-block region IBR3; however, the plurality of first quantum dots blocks and the plurality of second quantum dots blocks is inside the third inter-block region IBR3.

The step of patterning is some embodiments father includes developing the exposed third quantum dots material layer with a developing solution (FIG. 8C). The developing solution selectively removes the quantum dots material is the third inter-block region IBR3 over the quantum dots material of the third color is the plurality of third block regions BR3. In one example, the quantum dots material of the third color in the third inter-block region BR3 (unexposed) has a higher solubility in the developing solution that the quantum dots material of the third color in the plurality of third block regions BR3 (exposed). Subsequent to the developing step, third residual quantum dots material RQDM3 remains in the third inter-block region IBR3. At least a portion of the shard residual quantum dots material RQDM3 is on top of the plurality of first quantum dots blocks and the plurality of second quantum dots blocks.

Figure 8D:
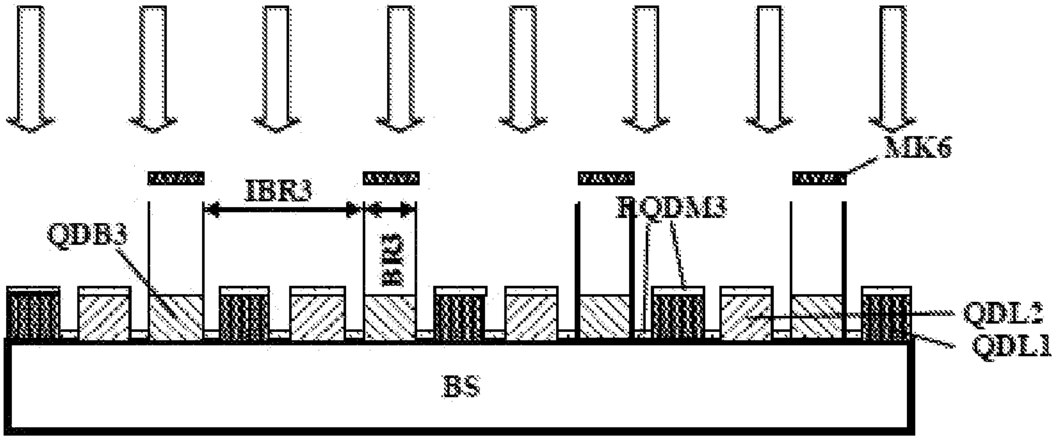

In some embodiments, the method further includes converting the first material in the third inter-block region IBR3 into a quencher; and allowing the quencher to quench third residual quantum dots material in the third inter-block region IBR3, thereby forming the third quantum dots layer QDL3. Referring to FIG. 8D, the step of converting the first material includes, subsequent to the developing step, exposing the third quantum dots material layer QDML3 with a second irradiation. Specifically, the converting step includes irradiating the third inter-block region IBR3 using a sixth mask plate MK6. In some embodiment, the first material is a material capable of generating, upon a first irradiation, a quencher quenching the quantum dots material. As discussed above, at least a portion of the third residual quantum dots material RQDM3 is on top of the plurality of first quantum dots blocks and the plurality of second quantum dots blocks. If untreated or unremoved, the third residual quantum dots material RQDM3 on top of the plurality of first quantum dots blocks and the plurality of second quantum dots blocks would cause color cross-talk or color mixing, adversely affecting display quality. The present method obviates this issue by quenching.

Figure 8E:
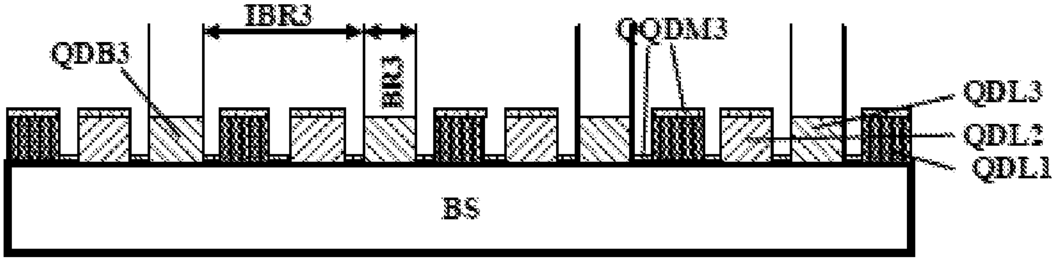

Referring to FIG. 8E, subsequent to quenching the third residual quantum dot material in the third inter-block region IBR3, the third residual quantum dots material is the third inter-block region IBR3 is at least partially converted into a third quenched quantum dots material QQDM3. A quantum dots layer of a third color QDL3 is formed, the quantum dots layer of the third color QDL3 includes a plurality of third quantum dots blocks QDB3 in the plurality of third block regions BR3, respectively, and the third quenched quantum dots material QQDM3 in the third inter-block region IBR3. The third quenched quantum dots material QQDM3 is no longer capable of emitting light.

In some embodiment, the method further includes at least partially converting the quantum dots material of the third color in the plurality of third block regions BR1 from a first form into a second form; and developing the third quantum dots material layer QQDM3. Optionally, the quantum dots material of the third color in the second form has a lower solubility is the developing solution than the quantum dots material of the third color is the fast form. Because the quantum dots material of the third color in the second form has a lower solubility in the developing solution than the quantum dots material of the third color in the first form, a majority of quantum dots material of the third color as the plurality of third block regions (second form) remains subsequent to the developing step, whereas a majority of quantum dots material of the third color in the third inter-block region (first form) are removed.

In some embodiments, at least partially converting the quantum dots material of the third color includes at least partially removing ligands chelated to the quantum dots material of the third color in the plurality of third block regions. The quantum dots material of the third color is the first form has more ligand chelated than the quantum dots material of the third color is the second form. In one example, the developing solution includes a non-polar solvent, the ligand is a molecule having a non-polar group, thus removing ligands from the quantum dots material of the third color rendering the quantum dots material of the third color more polar. Subsequent to removing ligands chelated to the quantum dots material of the third color in the plurality of ford block regions, the solubility of the quantum dots material of the third color in the plurality of third block regions (second forms) decreases, thereby remaining in the plurality of third block regions during the developing step.

In some embodiment, the third quantum dots material layer further includes a second material. Referring to FIG. 8B, upon irradiating the plurality of third block regions BR1 with the first irradiation, the second material undergoes a reaction to convert the quantum dot material of the third color in the plurality of third block regions BR3 how the first form into the second form. In some embodiments, upon irradiating the plurality of third block regions BR3, the second material reacts with a ligand of the quantum dots material of the third color to form a reacted ligand, the reacted ligand being released from the quantum dots material of the third color.

Optionally, additional quantum dots layer may be formed in a similar fashion.

Figure 9:
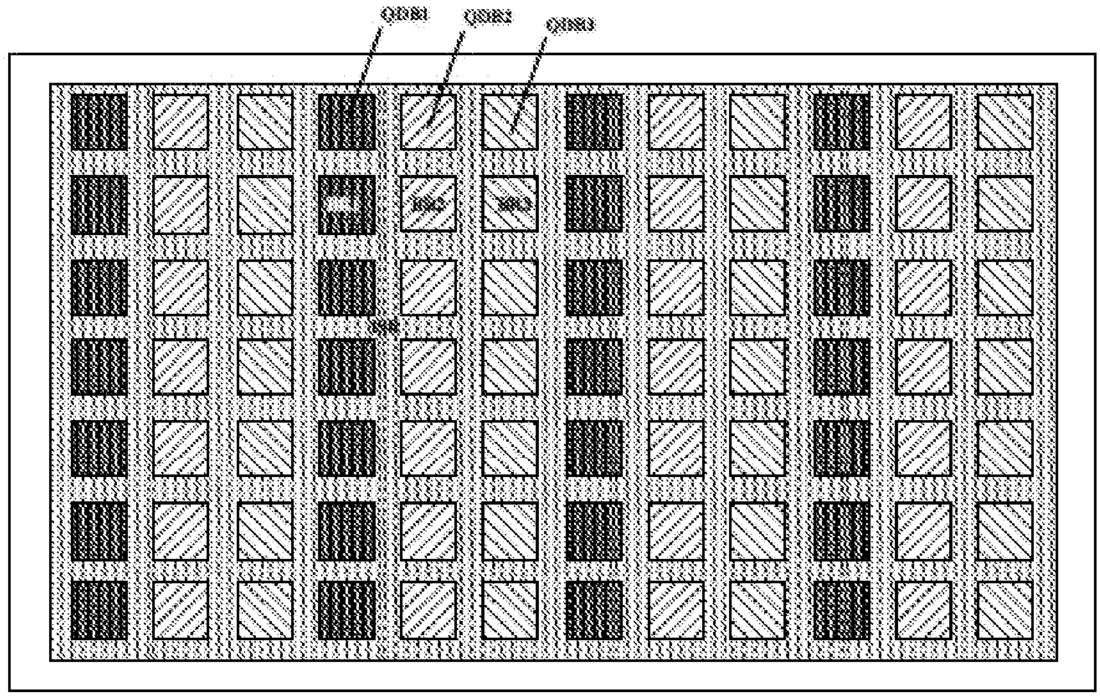
FIG. 9 is a plan view of a plurality of quantum dots layers fabricated according to a method in some embodiments according to the present disclosure.

FIG. 9 is a plan view of a plurality of quantum dots layers fabricated according to a method in some embodiments according to the present disclosure. As shown in FIG. 9, the plurality of first quantum dots blocks QDB1 are formed in the plurality of first block regions BR1; the plurality of second quantum dots blocks QDB2 are formed in the plurality of second block regions BR2; and the plurality of third quantum dots blocks QDB3 are formed in the plurality of third block regions BR3. Is an array substrate having the plurality of quantum dots layers, the plurality of first block regions BR1 are a plurality of first subpixel regions; the plurality of second block regions BR2 are a plurality of second subpixel regions; and the plurality of third block regions BR3 are a plurality of third subpixel regions. Ax inter-subpixel region ISR is outside of the plurality of fast block regions BR1, the plurality of second block regions BR2, and the plurality of thud block regions BR3.

Residual quantum dots materials in the inter-subpixel region ISK are quenched. First residual quantum dots materials underneath the plurality of second quantum dots blocks QDB2 and the plurality of third quantum dots blocks QDB1 are quenched. Second residual quantum dots materials on top of the plurality of first quantum dots blocks QDB1 and underneath the plurality of third quantum dots blocks QDB3 are quenched. Third residual quantum dots materials on top of the plurality of first quantum dots blocks QDB1 and the plurality of second quantum dots blocks QDB2 are quenched.

In some embodiments, the first color is a red color, the second color is a green color, and the third color is a blue color. Optionally, a concentration of the first material in the first quantum dots material solution containing a quantum dots material of a red color is greater than a concentration of the first material in the second quantum dots material solution containing a quantum dots material of a green color, which is in fun greater than a concentration of the first material in the third quantum dots material solution containing a quantum dots material of a blue color.

Optionally, a quantum dots material of a red color is formed prior to forming a quantum dots material of a green color, which is formed prior to forming a quantum dots material of a blue color.

Optionally, the ligand of the quantum dots material of the first color, the ligand of the quantum dots material of the second color, and the ligand of the quantum dots material of the third color, are the same.

Optionally, at least two of the ligand of the quantum dots material of the first color, the ligand of the quantum dots material of the second color, and the ligand of the quantum dots material of the third color, are different from each other.

Optionally, the second material in the first quantum dots material solution, the second material in the second quantum dots material solution, and the second material in the third quantum dots material solution, are the same.

Optionally, at least two of the second material in the first quantum dots material solution, the second material in the second quantum dots material solution, and the second material in the third quantum dots material solution, are different from each other.

Optionally, the first material in the first quantum dots material solution, the first material in the second quantum dots material solution, and the first material in the third quantum dots material solution, are the sauce.

Optionally, at least two of the first material in the first quantum dots material solution the first material in the second quantum dots material solution and the first material in the third quantum dots material solution, are different from each other.

In some embodiment, the first material and associated quenching steps may be omitted in the process of fabricating at least one quantum dots layer. Optionally, the first material and associated quenching steps is omitted in the process of fabricating the quantum dots layer of the second color. Optionally, the first material and associated quenching steps is omitted in the process of fabricating the quantum dots layer of the third color. Optionally, the first material and associated quenching steps is omitted in the process of fabricating the quantum dots layer of the second color, and in the process of fabricating the quantum dots layer of the third color:

In another aspect, the present disclosure provides a method of fabricating an array substrate. The method of fabricating the array substrate includes a process of fabricating a quantum dots layer, e.g., as exemplified in FIG. 1A to FIG. 1E; or a process of fabricating a plurality of quantum dots layers, e.g., as exemplified in FIG. 6A to FIG. 6E, FIG. 7A to FIG. 7E, and FIG. 8A to FIG. 8E. In some embodiment e method further includes forming a plurality of thin film transistors on a base substrate. In some embodiments, the method further includes forming a anode layer. In some embodiments, the method further includes forming one or more organic layers. Examples of organic layers include an electron transport layer, an electron injection layer, a bole transport layer, a hole injection layer, a bole barrier layer, and aw electron barrier layer. In some embodiments, the method further includes forming a cathode laver.

Optionally, the array substrate is a top emission-type array substrate.

Optionally, the array substrate is a bottom emission-type array substrate.

In some embodiments, the method further includes forming a thin film transistor back plate. Optionally, the step of forming the thin film transistor back plate includes forming a gate layer; forming a gate insulating layer on a side of the gate layer away from a base substrate; forming a semiconductor layer (including an active layer) on a side of the gate insulating layer away from the gate layer; forming a source-drain layer on a side of the semiconductor layer away from the gate insulating layer; forming a passivation layer on a side of the source-drain layer away from the gate insulating layer; forming an anode layer on a side of the passivation layer away how the source-drain layer; and forming a pixel definition layer on a side of the anode layer away from the passivation layer. The quantum dots layers are formed in a plurality of subpixel aperture defined by the pixel definition layer.

Optionally, light emitting elements having the quantum dots layer in the array substrate have a forward light emitting element structure.

Optionally, Light emitting elements having the quantum dots layer in the array substrate have an inverted light emitting element structure.

In one example, the light emitting elements having the quantum dots layer in the array substrate have a forward light emitting element structure. Subsequent to forming the this film transistor back plate, the method further includes forming a hole injection layer and a bole transport layer on the thin film transistor back plate; forming one or more quantum dots layers (as described in the present disclosure) on a side of the bole injection layer and the hole transport layer away from the thin film transistor back plate; forming an electron transport layer and an electron injection layer on a side of the one or more quantum dots layers away from the hole injection layer and the hole transport layer; and forming a cathode on a side of the electron transport layer and the electron injection layer away from the one or more quantum dots layers.

In one example, the light emitting elements having the quantum dots layer in the array substrate have an inverted light emitting element structure. Subsequent to forming the thin film transistor back plate, the method further includes forming an electron transport layer and an electron injection layer on the this file transistor back plate; forming one or more quantum dots layers (as described is the present disclosure) on a side of the election transport layer and the electron injection layer away from the thin film transistor back plate; forming a bole transport layer and a hole injection layer on a side of the one or more quantum dots layers away from the electron injection layer and the electros transport layer; and forming a cathode on a side of the hole transport layer and the hole injection layer away from the one or more quantum dots layers.

Optionally, the array substrate is a quantum dots light emitting diode array substrate, in which the one or more quantum dots layer function as light emitting layers.

Optionally, the array substrate is a quantum dots organic light emitting diode away substrate, in which the one or more quantum dots layers function as a color filter or color converter.

Optionally, the array substrate is a quantum dots micro light emitting diode array substrate, in which the one or more quantum dots layers function as a color filter or color converter.

In another aspect, the present disclosure provides a quantum dots material solution. In some embodiments, the quantum dots material solution includes a quantum dos material; a ligand chelated to the quantum dots material; a first material capable of generating, upon a first irradiation, a quencher quenching the quantum dots material; and a second material capable of at least partially converting the quantum dots material in the plurality of block regions from a first form into a second form. Optionally, the quantum dots material in the second form has a lower solubility in the developing solution than the quantum dots material in the first form.

In some embodiments, the first material comprises a photoacid generator, and the quencher comprises a hydrogen ion.

In some embodiments, the photoacid generator comprises a material selected from a group consisting of a triazine compound, an onium salt compound, and a benzenesulfonate compound.

In some embodiments, the second material is capable of, upon a second irradiation, undergoing a reaction to convert the quantum dots material from the first form into the second form.

In some embodiments, upon the second irradiation, the second material is capable of reaching with the ligand to form a reacted ligand, which is released from the quantum dots material.

In some embodiments, the first irradiation requires a light having a first wavelength range; and the second irradiation requires a light having a second wavelength range non-overlapping with the first wavelength range.

In some embodiments, the ligand comprises a sulfur-containing chelating group, a nitrogen-containing chelating group, an oxygen-containing chelating group, a phosphorus-containing chelating group, or any combination thereof.

In some embodiments, the ligand is a material selected from a group consisting of an oleic acid, an oleylamine, a trioctylphosphine, a trioctylphosphine oxide, and a dodecanethiol.

In some embodiments, the second material is an alkene compound or as alkyne compound.

In some embodiment, the quantum dots material comprises a material selected from a group consisting of CdS, CdSe, ZnSe, InP, PbS, CsPbCl3, CsPbBr3, CsPhI3, CdS/ZnS, CdSe/ZnS, ZnSe, InP/ZnS, PbS/ZnS, CsPbCl3/ZnS, CsPbBr3/ZnS, and CsPhI3/ZnS.

In another aspect, the present disclosure further provides an array substrate. In some embodiments, the array substrate includes a plurality of quantum dots layers. In some embodiments, the plurality of quantum dots layers includes a quantum dots layer of a first color, a quantum dots layer of a second color, and a quantum dots layer of a third color. Optionally, the quantum dots layer of the first color includes a plurality of first quantum dots blocks is a plurality of first subpixel regions, respectively. Optionally, the quantum dots layer of the second color includes a plurality of second quantum dots blocks in a plurality of second subpixel regions, respectively. Optionally, the quantum dots layer of the third color includes a plurality of third quantum dots blocks is a plurality of third subpixel regions, respectively.

In some embodiments, the array substrate includes quenched quantum dots material of the first color underneath the plurality of second quantum dots blocks and the plurality of third quantum dots blocks. For example, the array substrate includes quenched quantum dots material of the first color between a respective one of the plurality of second quantum dots blocks and a base substrate, and between a respective one of the plurality of third quantum dots blocks and the base substrate.

In some embodiments, the array substrate further includes quenched quantum dots material of the second color ow top of the plurality of first quantum dots blocks and underneath the plurality of third quantum dots blocks. For example, the array substrate farther includes quenched quantum dots material of the second color ox a side of a respective one of the plurality of first quantum dots blocks away from the base substrate, and between the respective one of the plurality of third quantum dots blocks and the base substrate.

In some embodiments, the array substrate further includes quenched quantum dots material of the third color on top of the plurality of first quantum dots blocks and the plurality of second quantum dots blocks. For example, the array substrate further includes quenched quantum dots material of the third color on a side of the respective one of the plurality of first quantum dots blocks away from the base substrate, and on a side of the respective one of the plurality of second quantum dots blocks away from the base substrate.

In some embodiments, the array substrate further includes the quenched quantum dots material of the first color, the quenched quantum dots material of the second color, and the quenched quantum dots material of the third color in an inter-subpixel region outside the plurality of first subpixel regions, the plurality of second subpixel regions, and the plurality of third subpixel regions.

As used herein, the term “quenched” means that light emitting capability of a material is reduced by at least 50%, e.g., by at least 60%, by at least 70%, by at least 80%, by at least 90%, by at least 95%, by at least 98%, by at least 99%, by at least 99.5%, by at least 99.9%, or 100%.

Figure 10:
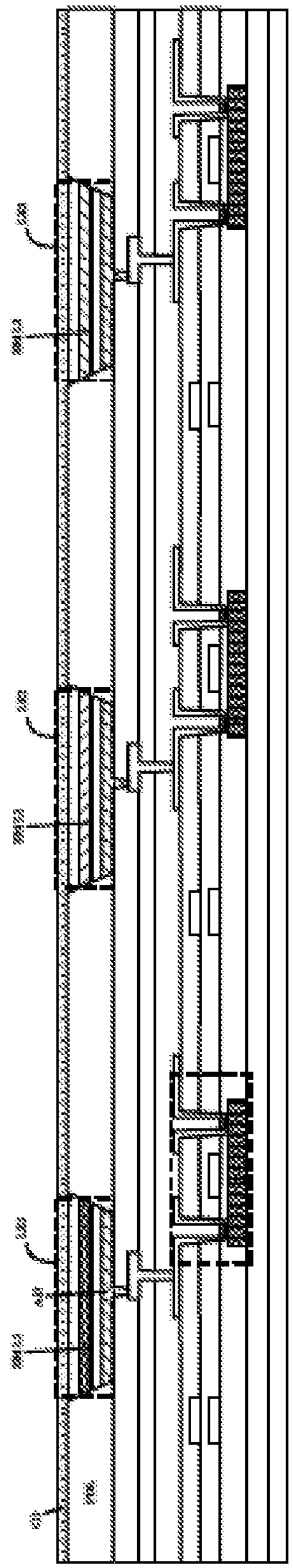
FIG. 10 is a schematic diagram illustrating the structure of a quantum dots light emitting diode array substrate in some embodiments according to the present disclosure.

In some embodiments, the array substrate is a quantum dots light emitting diode array substrate, and the plurality of quantum dots layers are a plurality of light emitting layers in the array substrate. FIG. 10 is a schematic diagram illustrating the structure of a quantum dots light emitting diode array substrate is souse embodiments according to the present disclosure. Referring to FIG. 10, the array substrate includes a plurality of light emitting elements of different colors, for example, a light emitting element of a first color LE1, a light emitting element of a second color LE2, and a light emitting element of a third color LES. A respective light emitting element includes an anode AD, a light emitting layer on the anode AD, and a cathode CD ow a side of the light emitting layer away from the anode AD. A pixel definition layer PDL defines a plurality of subpixel apertures for receiving the light emitting layers. The light emitting element of the first color LE1 includes a light emitting layer of the first color EML1; the light emitting element of the second color LE2 includes a light emitting layer of the second color EML2; and the light emitting element of the third color LE3 includes a light emitting layer of the third color EML3. In one example, the light emitting layer of the first color EML1 is a quantum dots layer of the first color (e.g., QDL1 in FIG. 8E); the light emitting layer of the second color EML2 is a quantum dots layer of the second color (e.g., QDL2 in FIG. 8E); and the light emitting layer of the third color EML3 is a quantum dots layer of the third color (e.g., QDL3 in FIG. 8E).

Figure 11:
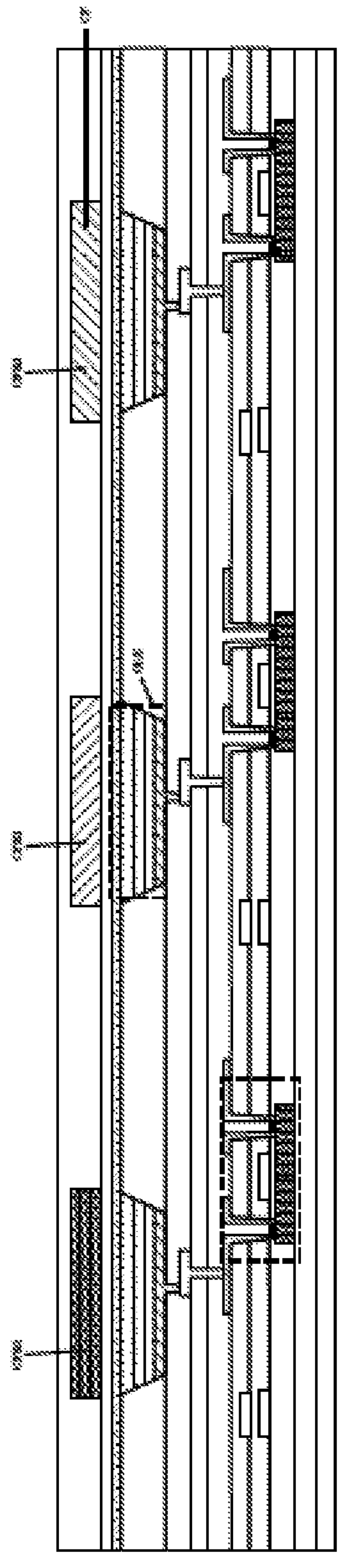
FIG. 11 is a schematic diagram illustrating the structure of as organic light emitting diode array substrate in some embodiments according to the present disclosure.

In some embodiments, the array substrate is an organic light emitting diode array substrate, and the plurality of quantum dots layers functions as a color filter layer in the array substrate. FIG. 11 is a schematic diagram illustrating the structure of as organic light emitting diode array substrate in some embodiments according to the present disclosure. Referring to FIG. 11, the array substrate includes a plurality of organic light emitting diodes OLE configured to emit light. The array substrate further includes a color filter layer CF on a side of the plurality of organic light emitting diodes OLE. In some embodiments, the color filter layer CF includes a plurality of first color filter blocks CFB1 and a plurality of second color filter blocks CFB2. In some embodiments, the plurality of first color filter blocks CFB1 are parts of a quantum dots layer of the first color (e.g., QDL1 in FIG. 8E); and the plurality of second color filter blocks CFB2 are parts of a quantum dots layer of the second color (e.g., QDL2 in FIG. 8E).

In some embodiment, the array substrate further includes a plurality of third color filter blocks CFB3. Optionally, the plurality of third color filter blocks CFB3 are transparent blocks.

In some embodiments, the array substrate further includes a plurality of third color filter blocks CFB3. Optionally, the plurality of third color filter blocks CFB3 are part of a quantum dots layer of the third color (e.g., QDL3 in FIG. 8E).

Figure 12:
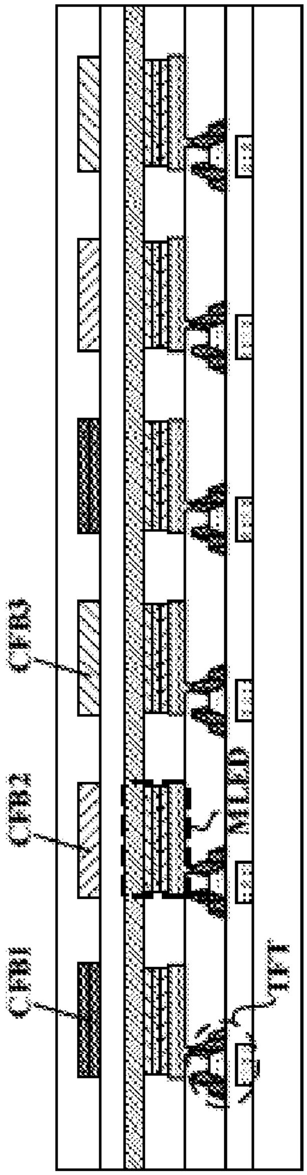
FIG. 12 is a schematic diagram illustrating the structure of a micro light emitting diode array substrate in some embodiments according to the present disclosure.

In some embodiments, the array substrate is a micro light emitting diode array substrate, and the plurality of quantum dots layers functions as a color filter layer in the army substrate. FIG. 12 is a schematic diagram illustrating the structure of a micro light emitting diode array substrate in some embodiments according to the present disclosure. Referring to FIG. 12, the array substrate includes a plurality of thin film transistors TFT and a plurality of micro light emitting diodes MLED respectively connected to the plurality of thin film transistors TFT. The array substrate further includes a colon filter layer CF on a side of the plurality of organic light emitting diodes OLE. In some embodiments, the color filter layer CF includes a plurality of first color filter blocks CFB1 and a plurality of second color filter blocks CFB2. In some embodiments, the plurality of first color filter blocks CFB1 are parts of a quantum dots layer of the first color (e.g., QDL1 in FIG. 8E), and the plurality of second color filter blocks CFB2 are parts of a quantum dots layer of the second color (e.g., QDL2 in FIG. 8E).

In some embodiments, the array substrate further includes a plurality of third color filter blocks CFB3. Optionally, the plurality of third color filter blocks CFB3 are transparent blocks.

In some embodiments, the array substrate further includes a plurality of third color filter blocks CFB3. Optionally, the plurality of third color filter blocks CFB3 are part of a quantum dots layer of the third color (e.g., QDL3 in FIG. 8E).

In another aspect, the present disclosure provides a display apparatus. Is some embodiments, the display apparatus includes an army substrate described herein, and an integrated circuit connected to the army substrate. Examples of appropriate display apparatuses include, but are not limited to, as electronic paper, a mobile phone, a tablet computer, a television, a monitor, a notebook computer, a digital album, a GPS, etc.

The foregoing description of the embodiments of the invention has been presented for proposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled is this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific member has been given. Any advantages and benefits described may not apply to all embodiments of the invention. It should be appreciated that variations may be made is the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A quantum dots material solution, comprising:

a quantum dots material;

a ligand chelated to the quantum dots material;

a first material capable of generating, upon a first irradiation, a quencher quenching the quantum dots material; and a second material capable of at least partially converting the quantum dots material in a plurality of block regions from a first form into a second form;

wherein the quantum dots material in the second form has a lower solubility in a developing solution than the quantum dots material in the first form.

2. The quantum dots material solution of claim 1, wherein the first material comprises a photoacid generator, and the quencher comprises a hydrogen ion.

3. The quantum dots material solution of claim 2, wherein the photoacid generator comprises a material selected from a group consisting of a triazine compound, an onium salt compound, and a benzenesulfonate compound.

4. The quantum dots material solution of claim 1, wherein the second material is capable of, upon a second irradiation, undergoing a reaction to convert the quantum dots material from the first form into the second form.

5. The quantum dots material solution of claim 4, wherein, upon the second irradiation, the second material is capable of reacting with the ligand to form a reacted ligand, which is released from the quantum dots material.

6. The quantum dots material solution of claim 1, wherein the ligand comprises a sulfur-containing chelating group, a nitrogen-containing chelating group, an oxygen-containing chelating group, a phosphorus-containing chelating group, or any combination thereof.

7. The quantum dots material solution of claim 1, wherein the ligand is a material selected from a group consisting of an oleic acid, an oleylamine, a trioctylphosphine, a trioctylphosphine oxide, and a dodecanethiol.

8. The quantum dots material solution of claim 1, wherein the second material is an alkene compound or an alkyne compound.

9. A method of forming a quantum dots layer, comprising:

forming a quantum dots material layer comprising a first material;

patterning the quantum dots material layer to form a plurality of quantum dots blocks in a plurality of block regions, respectively;

converting the first material in an inter-block region into a quencher; and allowing the quencher to quench residual quantum dots material in the inter-block region, thereby forming the quantum dots layer.

10. The method of claim 9, wherein forming the quantum dots material layer comprises disposing a quantum dots material solution comprising the first material.

11. The method of claim 9, wherein the first material comprises a photoacid generator, and the quencher comprises a hydrogen ion.

12. The method of claim 9, wherein converting the first material comprises irradiating the inter-block region.

13. The method of claim 9, wherein patterning the quantum dots material layer comprises:

at least partially converting the quantum dots material in the plurality of block regions from a first form into a second form; and developing the quantum dots material layer.

14. The method of claim 13, wherein developing the quantum dots material layer is performed using a developing solution;

wherein the quantum dots material in the second form has a lower solubility in the developing solution than the quantum dots material in the first form.

15. The method of claim 13, wherein at least partially converting the quantum dots material comprises at least partially removing ligands chelated to the quantum dots material in the plurality of block regions.

16. The method of claim 13, wherein at least partially converting the quantum dots material comprises irradiating the plurality of block regions;

the quantum dots material layer further comprises a second material; and upon irradiating the plurality of block regions, the second material undergoes a reaction to convert the quantum dots material in the plurality of block regions from the first form into the second form.

17. The method of claim 16, wherein upon irradiating the plurality of block regions, the second material reacts with a ligand of the quantum dots material to form a reacted ligand, the reacted ligand being released from the quantum dots material.

18. A method of fabricating a display panel, comprising forming the quantum dots layer according to the method of claim 9;

wherein the method of fabricating the display panel comprises:

forming a first quantum dots material layer comprising the first material on a base substrate;

patterning the first quantum dots material layer to form a plurality of first quantum dots blocks in a plurality of first block regions, respectively;

converting the first material in a first sub-region of the inter-block region into a quencher; and allowing the quencher to quench first residual quantum dots material in the first sub-region, thereby forming the first quantum dots layer;

subsequent to forming the first quantum dots layer, the method further comprises:

forming a second quantum dots material layer comprising the first material on the base substrate;

patterning the second quantum dots material layer to form a plurality of second quantum dots blocks in a plurality of second block regions, respectively;

converting the first material in a second sub-region of the inter-block region into a quencher; and allowing the quencher to quench second residual quantum dots material in the second sub-region, thereby forming the second quantum dots layer;

subsequent to forming the second quantum dots layer, the method further comprises:

forming a third quantum dots material layer comprising the first material on the base substrate;

patterning the third quantum dots material layer to form a plurality of third quantum dots blocks in a plurality of third block regions, respectively;

converting the first material in a third sub-region of the inter-block region into a quencher; and allowing the quencher to quench third residual quantum dots material in the third sub-region, thereby forming the third quantum dots layer.

* * * * *